(12) United States Patent
Chiu

(10) Patent No.: US 8,936,989 B2
(45) Date of Patent: Jan. 20, 2015

(54) METHOD FOR MANUFACTURING SEMICONDUCTOR DEVICES USING SELF-ALIGNED PROCESS TO INCREASE DEVICE PACKING DENSITY

(75) Inventor: Tzu-Yin Chiu, Milpitas, CA (US)

(73) Assignee: Tzu-Yin Chiu, Milpitas, CA (US)

( * ) Notice: Subject to any disclaimer, the term of this patent is extended or adjusted under 35 U.S.C. 154(b) by 608 days.

(21) Appl. No.: 12/101,120

(22) Filed: Apr. 10, 2008

(65) Prior Publication Data
US 2008/0254587 A1 Oct. 16, 2008

Related U.S. Application Data

(60) Provisional application No. 60/922,836, filed on Apr. 10, 2007.

(51) Int. Cl.
*H01L 21/8234* (2006.01)
*H01L 21/768* (2006.01)
*H01L 29/78* (2006.01)

(52) U.S. Cl.
CPC .... *H01L 21/76897* (2013.01); *H01L 21/76838* (2013.01); *H01L 21/76889* (2013.01); *H01L 21/76895* (2013.01); *H01L 29/78* (2013.01)
USPC ............ 438/301; 257/E21.627; 257/E21.619; 257/E21.151

(58) Field of Classification Search
USPC ................................................ 438/299, 238
See application file for complete search history.

(56) References Cited

U.S. PATENT DOCUMENTS

| | | | | |
|---|---|---|---|---|
| 4,419,812 A | * | 12/1983 | Topich | 438/238 |
| 5,827,764 A | * | 10/1998 | Liaw et al. | 438/238 |
| 6,190,977 B1 | * | 2/2001 | Wu | 438/300 |
| 6,214,679 B1 | * | 4/2001 | Murthy et al. | 438/299 |
| 6,251,711 B1 | * | 6/2001 | Fang et al. | 438/142 |
| 2002/0042183 A1 | * | 4/2002 | Chan et al. | 438/299 |
| 2008/0164528 A1 | * | 7/2008 | Cohen et al. | 257/365 |

* cited by examiner

*Primary Examiner* — David Vu
*Assistant Examiner* — Jonathan Han
(74) *Attorney, Agent, or Firm* — Kilpatrick Townsend & Stockton LLP

(57) ABSTRACT

A method for fabricating a semiconductor integrated circuit having a self-aligned structure, the method comprises the steps of: providing a semiconductor substrate; forming a gate dielectric layer, a first polysilicon layer, and a first capping layer on top of the semiconductor substrate; patterning the first capping layer, the first polysilicon layer and stopping on the gate dielectric layer to form a gate structure; forming and patterning a composite dielectric layer, a second polysilicon layer, and a second capping layer to form an interconnect structure; forming a composite spacer; removing the photoresist layer; forming a third polysilicon layer; making blanket removal of the third polysilicon layer to leave a remain third polysilicon layer; removing the first and the second capping layer; forming a source and a drain; and forming a silicide layer overlying the gate structure, source, drain and the interconnect structure to form the self-aligned structure.

10 Claims, 21 Drawing Sheets

METHOD FOR MANUFACTURING SEMICONDUCTOR DEVICES USING SELF-ALIGNED PROCESS TO INCREASE DEVICE PACKING DENSITY

RELATED APPLICATIONS

This application claims priority benefit of U.S. Provisional Application Ser. No. 60/922,836, filed Apr. 10, 2007, which is herein incorporated by reference.

BACKGROUND

1. Field of Invention

The present invention relates to a method for manufacturing semiconductor devices. More particularly, the present invention relates to a method using self-aligned process to increase device-packing density.

2. Description of Related Art

In integrated circuit (IC) design, much effort is dedicated to improving the performance and complexity of the IC, while increasing the packing density of the circuit. Packing density is the number of devices capable of being packed onto a given chip area, where in recent years semiconductor devices are being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to reduce the size of a semiconductor device in a cost efficient and effective way.

Various techniques have been used to reduce the size of semiconductor devices. An example of such techniques includes the use of sidewall spacers on edges of metal oxide silicon (MOS) gate structures. Such sidewall spacers are used to form a self-aligned contact region, which is smaller in size and more efficient to manufacture. Other techniques use increasingly smaller gate structure, shallower implanting techniques, among others. Unfortunately, many limitations exist with the conventional semiconductor devices. The reduced cell size is based upon practical limits of processes and equipments used for the manufacture of semiconductor devices.

Please refer to FIG. 1, a cell of a conventional MOS gate structure having an active area 102 width of W. W is calculated as:

$$W = L + 2(S + C + E) \qquad (1)$$

where L is the minimum length for a gate polysilicon 104, S is the minimum distance between a contact open 106 and the gate polysilicon, C is the minimum contact length, and E is the minimum distance between the contact open and the edge of the active area.

From the equation 1, assuming L is the minimum resolution Rm, then from the design rules of various technologies based on conventional CMOS process, S+C is approximately 2 Rm, and E is approximately 0.5 Rm. Therefore, W is approximately 6 Rm.

For the forgoing reasons, there is a need for a new method of fabricating an IC wherein the device size may be significantly reduced without having to leverage upon pushing the expensive lithography further.

SUMMARY

The present invention is directed to a method for increasing device-packing density using a method of forming a self-aligned device structure. The method comprises the steps of: providing a semiconductor substrate with an active area surrounded by an isolation structure; sequentially forming a gate dielectric layer, a first polysilicon layer, and a first capping layer on top of the semiconductor substrate; patterning the first capping layer, the first polysilicon layer and stopping on the gate dielectric layer to form a gate structure on top of the active area; sequentially forming a composite dielectric layer, a second polysilicon layer, and a second capping layer covering the gate structure and the semiconductor substrate; defining a patterned photo-resist layer on the second capping layer; pattering the second capping layer, the second polysilicon layer and the composite dielectric layer to form an interconnect structure, wherein the interconnect structure comprising the remain part of the second capping layer, the second polysilicon layer and the composite dielectric layer; exposing a surface of the substrate within an active area; forming a composite spacer surrounding the sidewalls of the gate structure; removing the photo-resist layer over the interconnect structure located partially on the isolation structures; forming a third polysilicon layer covering the gate structure, the interconnect structure and the exposed surface within the active area; making blanket removal of the third polysilicon layer over the first capping layer, the second capping layer and a shallow trench isolation area to leave a remain third polysilicon layer having intimate contacts to the exposed surface within the active area and the second polysilicon layer of the interconnect structure; removing the first and the second capping layer; doping the remain third polysilicon layer and the second polysilicon layer to form a source and a drain; and forming a silicide layer overlying the gate structure, source, drain and the interconnect structure to form the self-aligned structure.

Alternatively, in another embodiment of the present invention, another method for fabricating a semiconductor integrated circuit having composite spacer structure is provided. A semiconductor IC is provided by the alternative method without forming the second capping layer. Furthermore, a selective polysilicon growth is used to fill the recess between the gate structure and the interconnect structure with polysilicon, whereas in the first embodiment of the present invention, the polysilicon filling the recess is formed by an etch-back method. In any case, the height of the polysilicon formed in the recess is lower than the height of the spacers by a sufficient amount, so that isolation is ensured between the gate structure and the interconnect structures.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
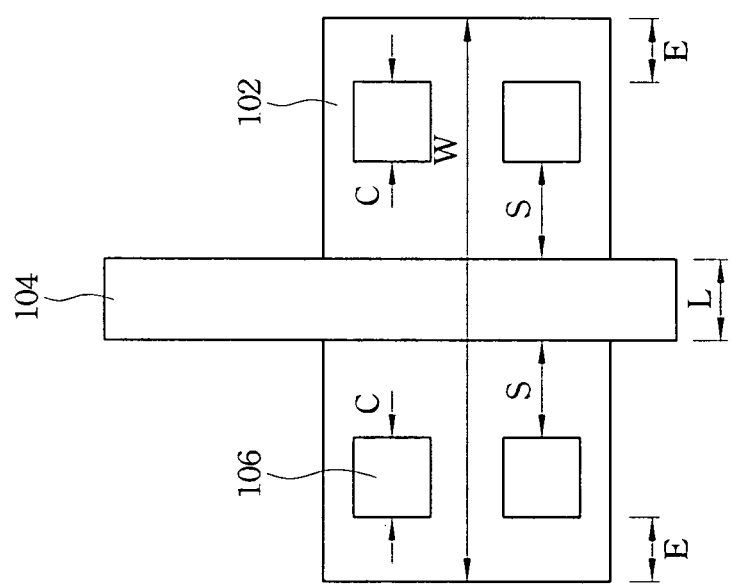
FIG. 1 is a layout view of a conventional MOS transistor with double contacts.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
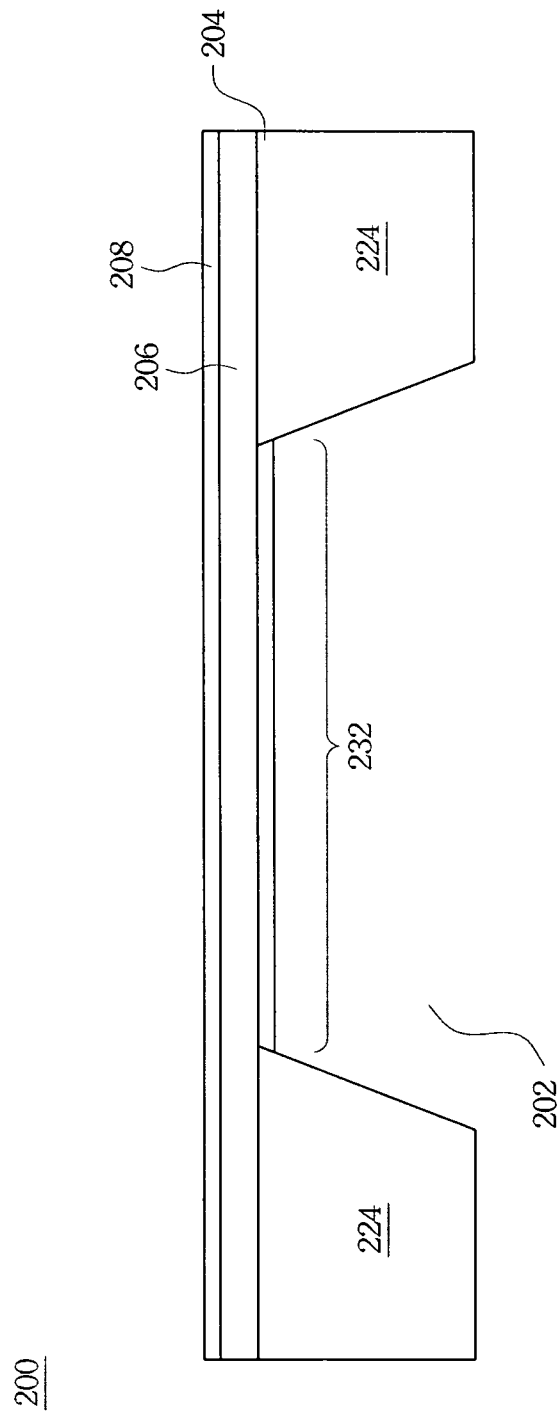
FIG. 2A-2J is illustrating steps in the method for increasing device-packing density according to a first embodiment of the present invention.
Figure 2B:
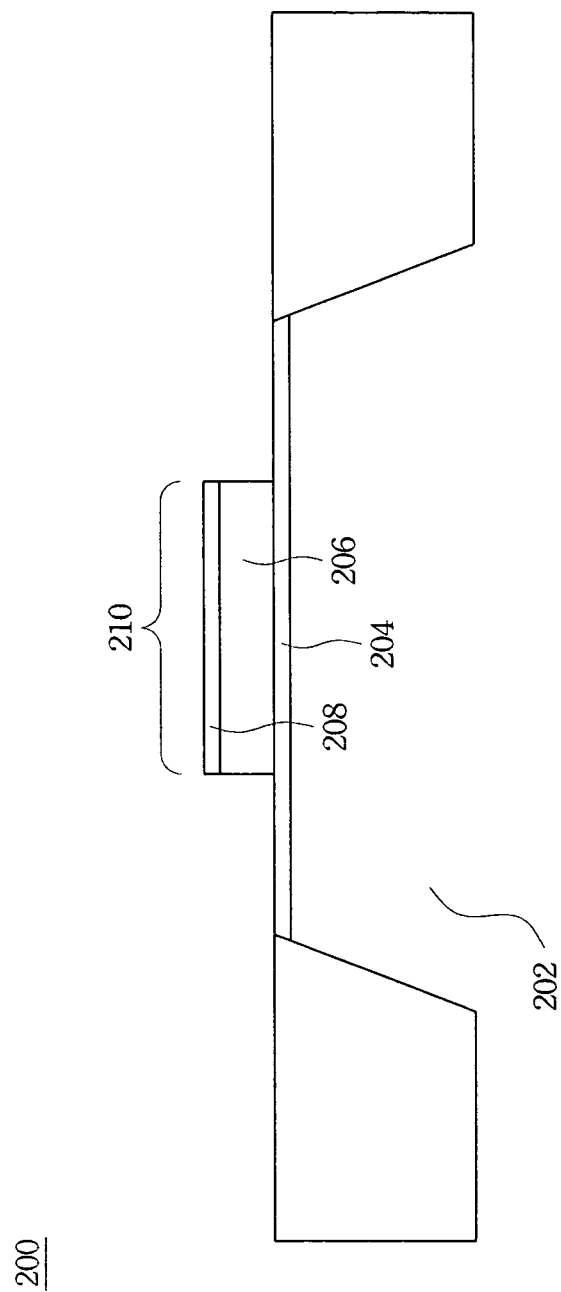
Figure 2C:
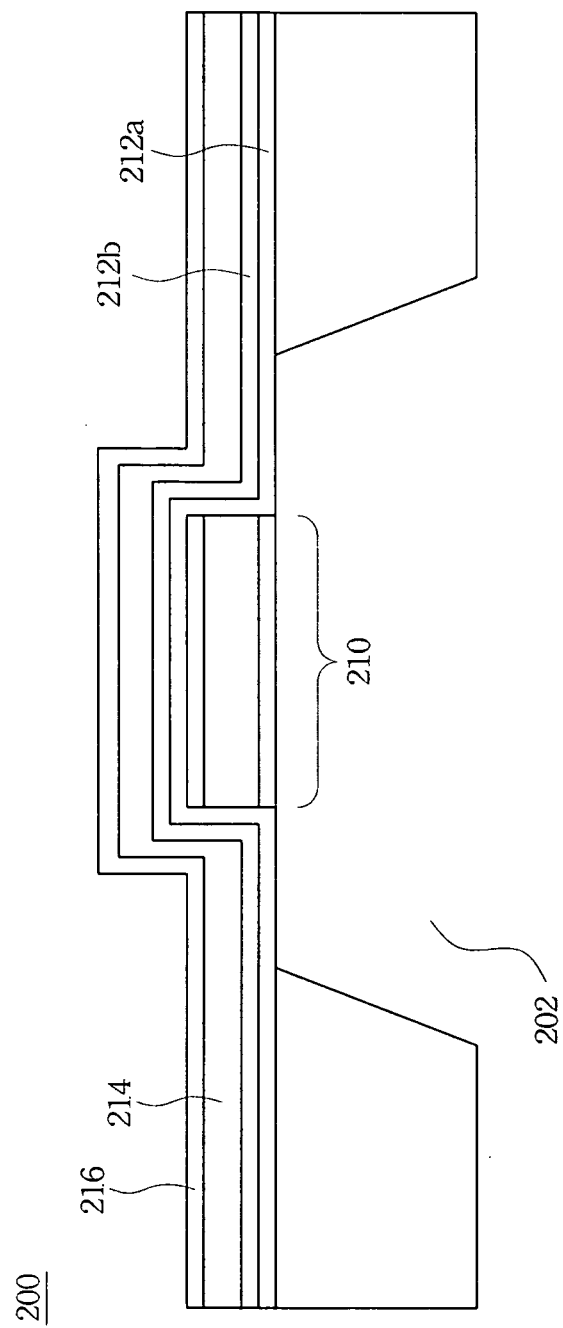
Figure 2D:
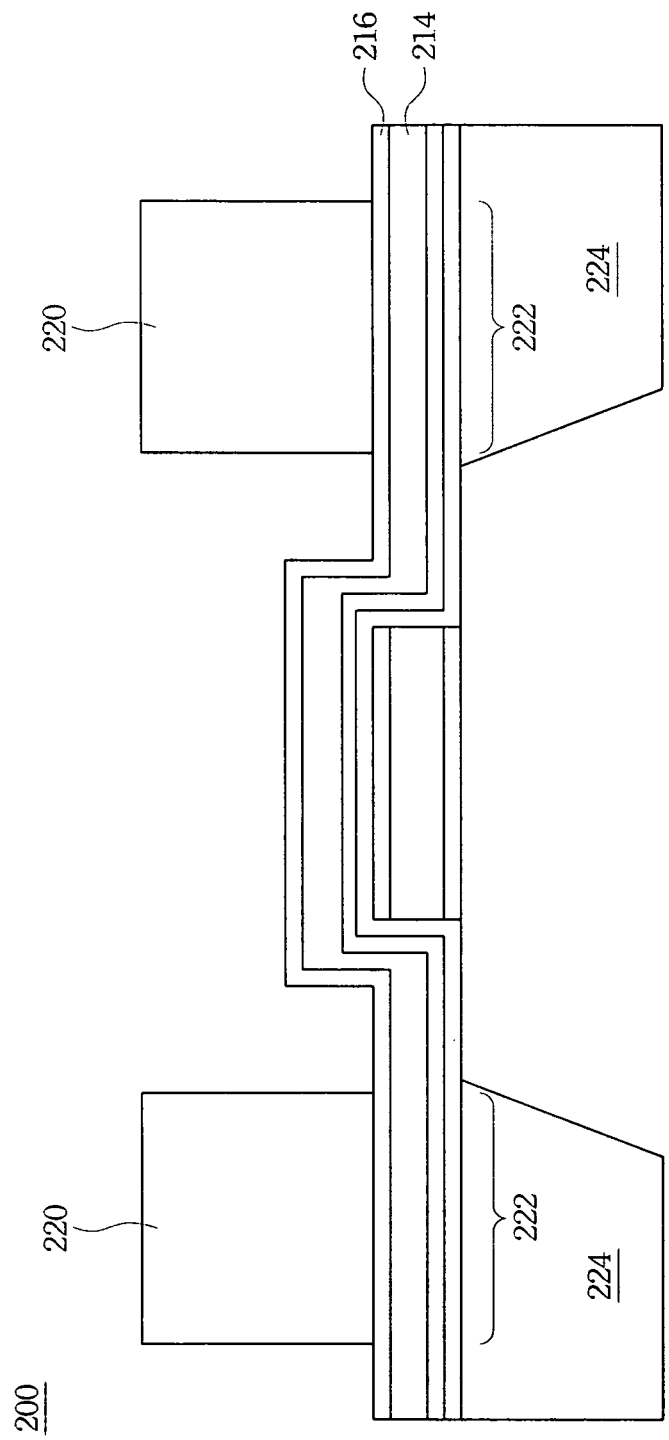

Please refer to FIG. 2A to 2J, illustrating steps in a method for fabricating a semiconductor integrated circuit having a self-aligned structure according to a first embodiment of the present invention. FIG. 2A shows a transistor 200 providing a semiconductor substrate 202 with an active area 232 surrounded by an isolation structure 224, wherein the isolation structure 224 is a shallow trench isolation structure. After gate dielectric layer 204 is grown, proper channel doping is introduced followed by sequential blanket deposition of a first polysilicon layer 206 and a first capping layer 208 on top the semiconductor substrate 202. The gate dielectric layer 204 is an oxide layer. The first capping layer 208 may be a nitride layer. As shown in FIG. 2B, after the above mentioned layers are established, a gate structure 210 is formed by patterning the first capping layer 208, the first polysilicon layer 206, and stopping on the first dielectric layer 204. Patterning involves masking the gate structure 210 and etching the remaining portions of the layers anisotropically and selectively. Proper dopant is introduced into the substrate along the gate edge. As shown in FIG. 2C, the next step is to form a composite dielectric layer 212 overlaying the semiconductor substrate 202 and on the gate structure 210. The composite dielectric layer 212 in this embodiment comprises dielectric sub-layers 212a and 212b. On top of the composite dielectric layers 212, a second polysilicon layer 214 is formed having a second capping layer 216 overlaid thereon. The second capping layer 216 may be a nitride layer.

Figure 2E:
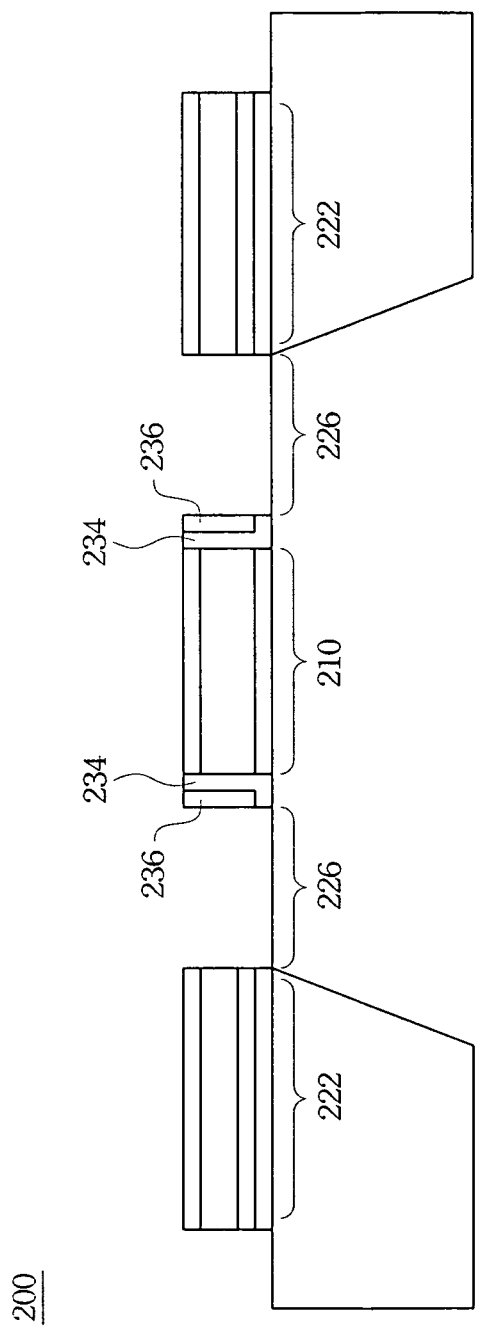

The next step is to form an interconnect structure 222. Please refer to FIG. 2D, the interconnect structure 222 are defined using a patterned photo-resist layer 220, wherein the interconnect structure 222 are partially on top of the isolation structure 224 formed in the substrate using conventional techniques. FIG. 2E illustrates that the second capping layer 216 and the second polysilicon layer 214 are etched isotropically and should be completely removed from around the gate structure 210, stopping selectively on composite dielectric layer 212. The composite dielectric layer 212 is anisotropically etched to expose a surface 226 of the within the active area 232 of the semiconductor substrate 202. The residue of the composite dielectric layer 212a and 212b forms a composite layer comprising a first spacer 234 and a second spacer 236 respectively surrounding the sidewalls of the gate structure 210.

In forming the spacers 234 and 236, an anisotropic etching technique may be utilized to etch the dielectric layer 212 in the vertical direction removing a portion of the dielectric layers 212 on top of the gate structure 210 and in the exposed surface 226, while the remaining portions of the composite dielectric layer 212 act as the sidewall spacers of the gate structure 210. Then the photo-resist layer 220 is stripped to complete the patterning of the interconnect structure 222.

Figure 2F:
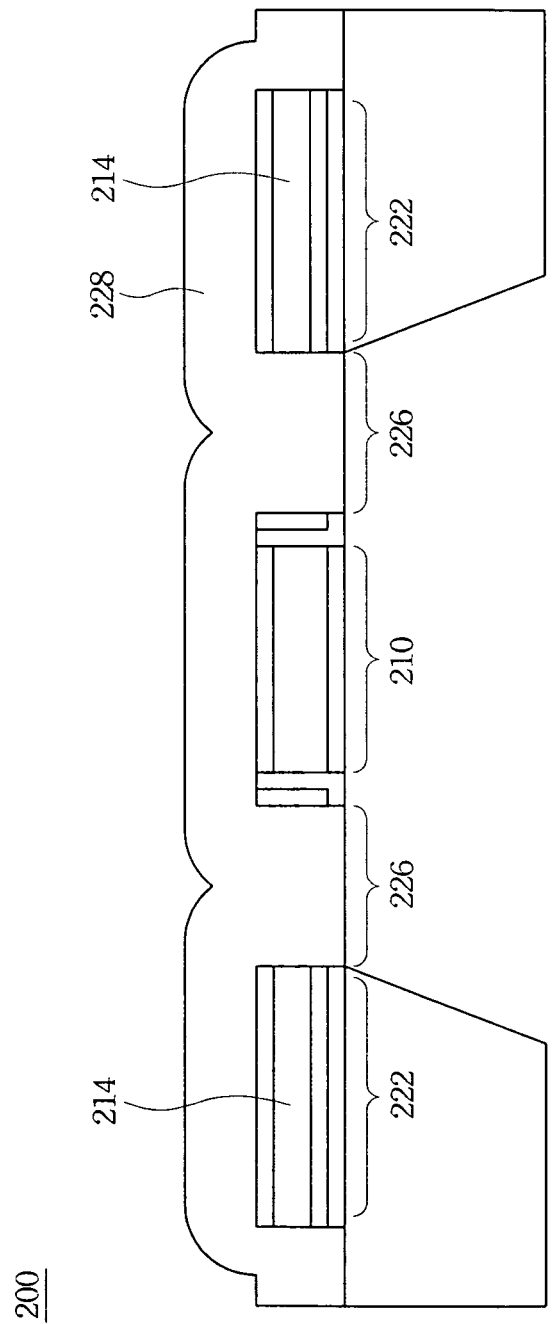
Figure 2G:
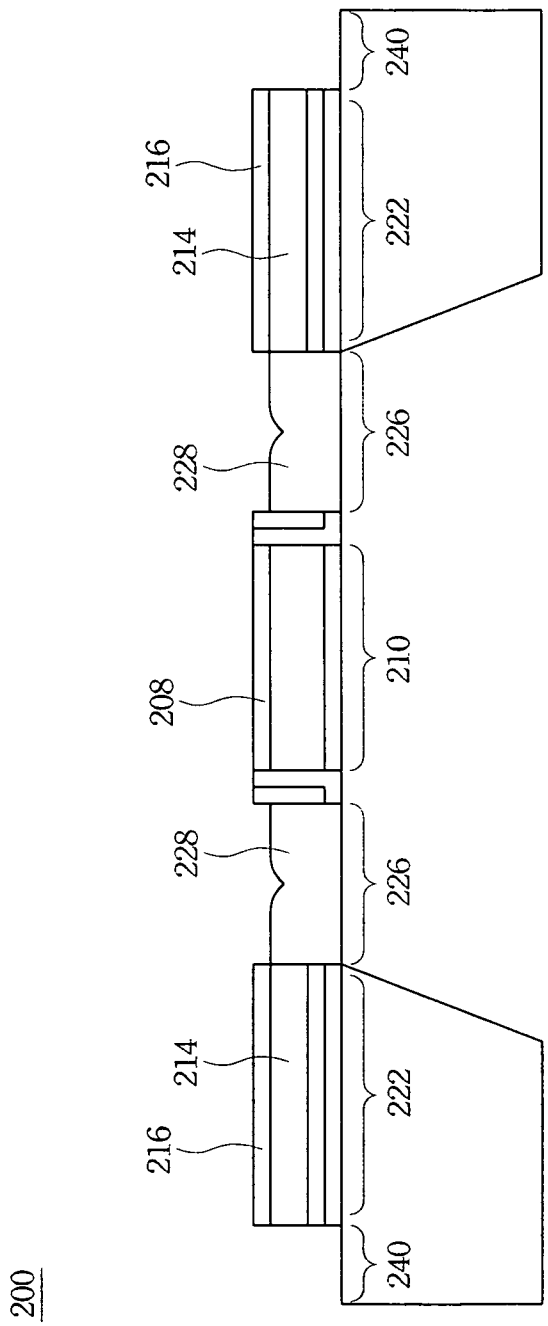

The next step is to deposit a third blanket polysilicon layer 228 covering the entire transistor 200 as illustrated in FIG. 2F. The third polysilicon layer 228 is formed on the gate structure 210, and the interconnect structure 222. The third polysilicon layer 228 makes intimate contact to the exposed substrate surface 226 and the side of the second polysilicon layer 214 in the interconnection structure 222. As shown in FIG. 2G, a portion of the third polysilicon layer 228 is removed isotropically to expose the first capping layer 208, the second capping layer 216 and a shallow trench isolation area 240 and leave the remaining third polysilicon layer 228 on the exposed surface 226 and in contact with the second polysilicon layer 214 of the interconnect structure 222. A portion of the third polysilicon layer 228 may be removed by an etchback technique.

Figure 2H:
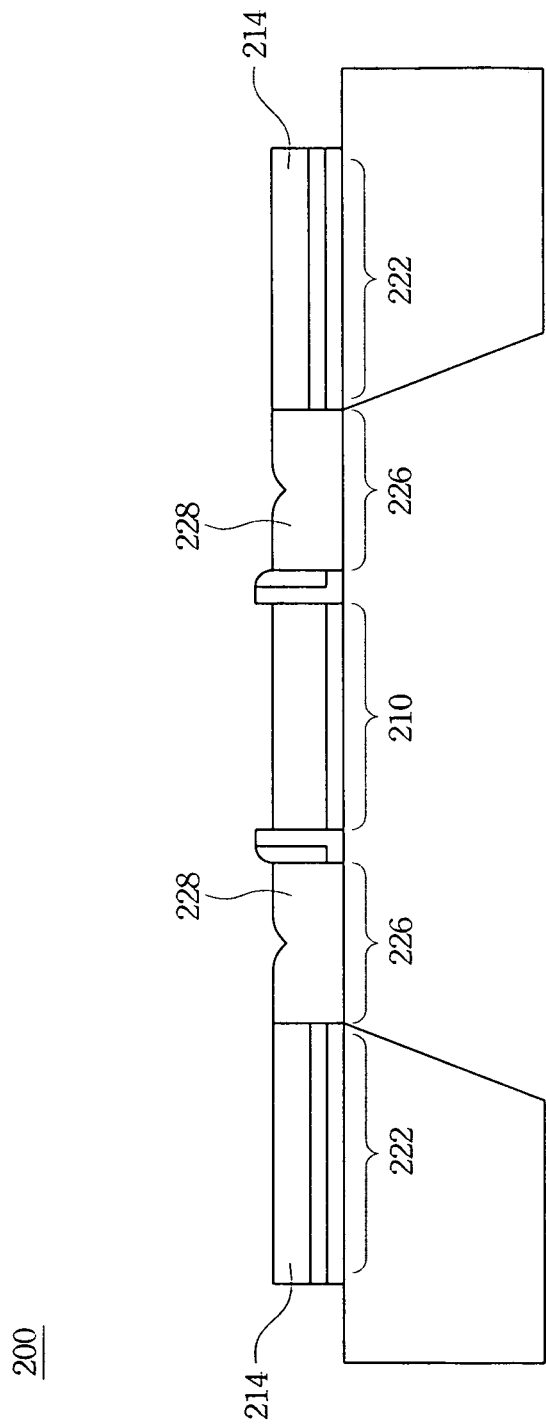
Figure 2I:
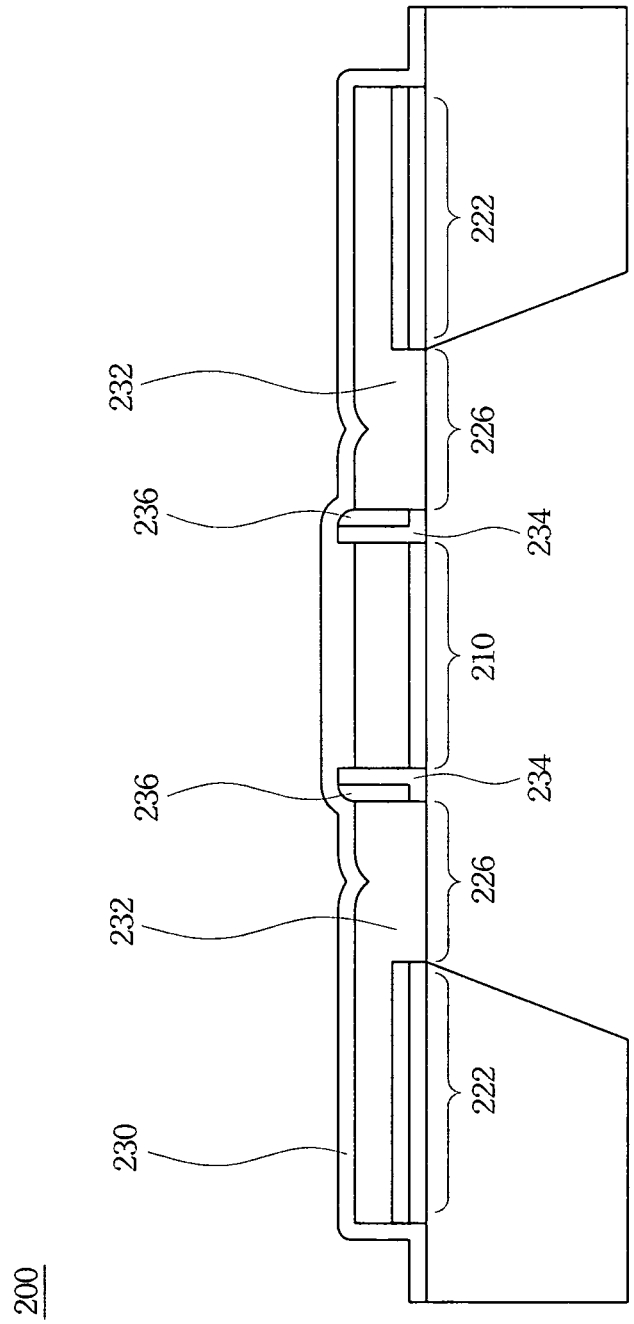
Figure 2J:
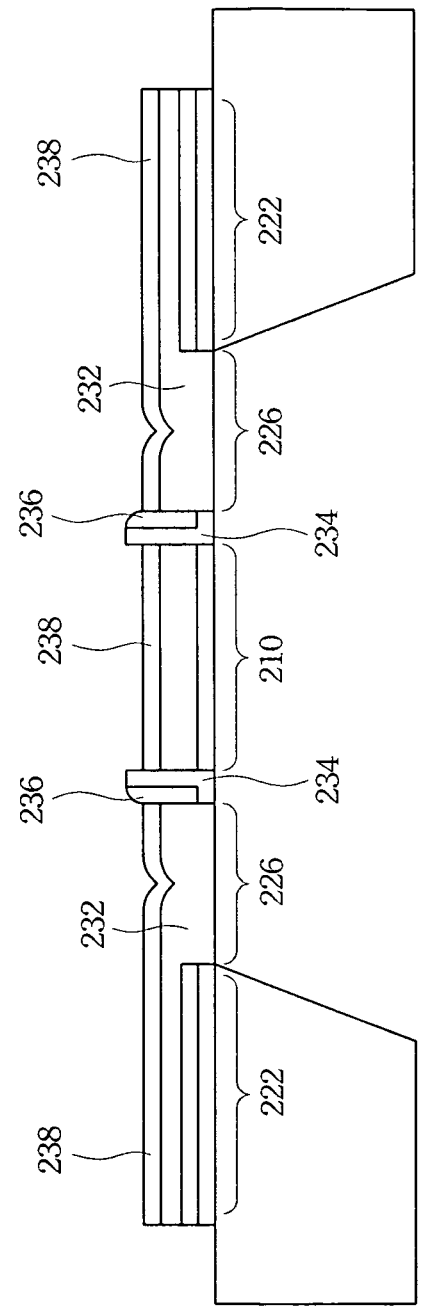

In FIGS. 2H and 2I, the remaining first and second capping layers 208 and 216 are removed. The residue third polysilicon layer 228 and the second polysilicon layer 214 of the interconnect structure 222 together form a continuous polysilicon structure to be named source and drain polysilicon. It's noticed that, the dimension of the exposed active area for source and drain can be shrunk to less than minimum lithographic dimension. After defining the gate, source and drain area lithographically for appropriate dopant introduction, proper thermal treatment are applied to activate and drive-in the dopants to form gate 206, source and drain, with the proper conductivity. The source and drain is isolated from the gate structure 206 by the first and the second spacer 234 and 236. A blanket metal layer 230 of appropriate choice is deposited and a self-aligned silicidation process is applied. The metal layer 230 will react with polysilicon, but not with dielectric materials, thus the metal and polysilicon reaction forms a silicide layer 238 at the interface of the polysilicon of the gate structure 210 and the source and drain but remain unreacted over the first and second spacers 234 and 236 and the exposed surface of the oxide layer 224. Finally, as shown in FIG. 2J, after removing the unreacted residue metal layer, the silicide layer 238 is exposed on the gate structure 206 and on the source and drain so that the sidewalls of the gate structure 206, namely the first and second spacer 234 and 236 isolates the gate structure 206 from the interconnect structure 222. The silicide layer 238 may be nickel salicide, titanium salicide, cobalt salicide, platinum salicide, or tantalum salicide.

With the composite spacers transistor, latch up considerations are taken into account, the isolation is enhanced to suppress current leakage from the gate structure 210 to the interconnect structure 222. Alternatively, the method for increasing device-packing density using composite spacers in a self-aligned device structure may be performed without etching back the third polysilicon layer, rather selectively growing the polysilicon layer on the exposed surface.

Figure 3A:
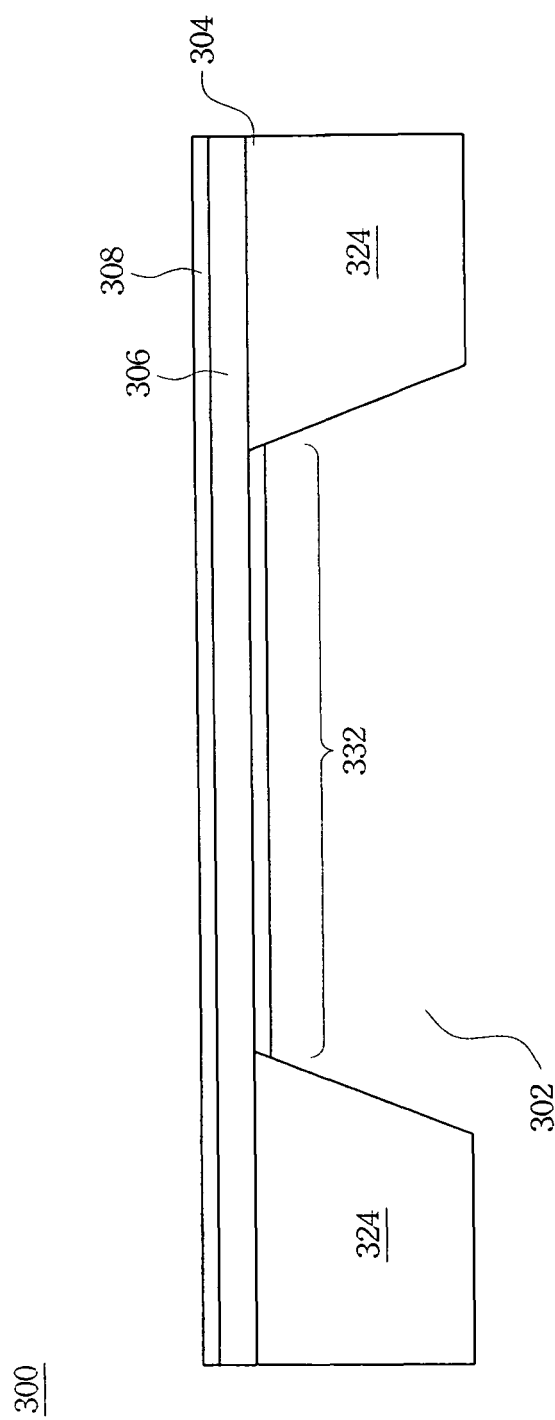
FIG. 3A-3I is illustrating steps in the method for increasing device-packing density according to a second embodiment of the present invention.
Figure 3B:
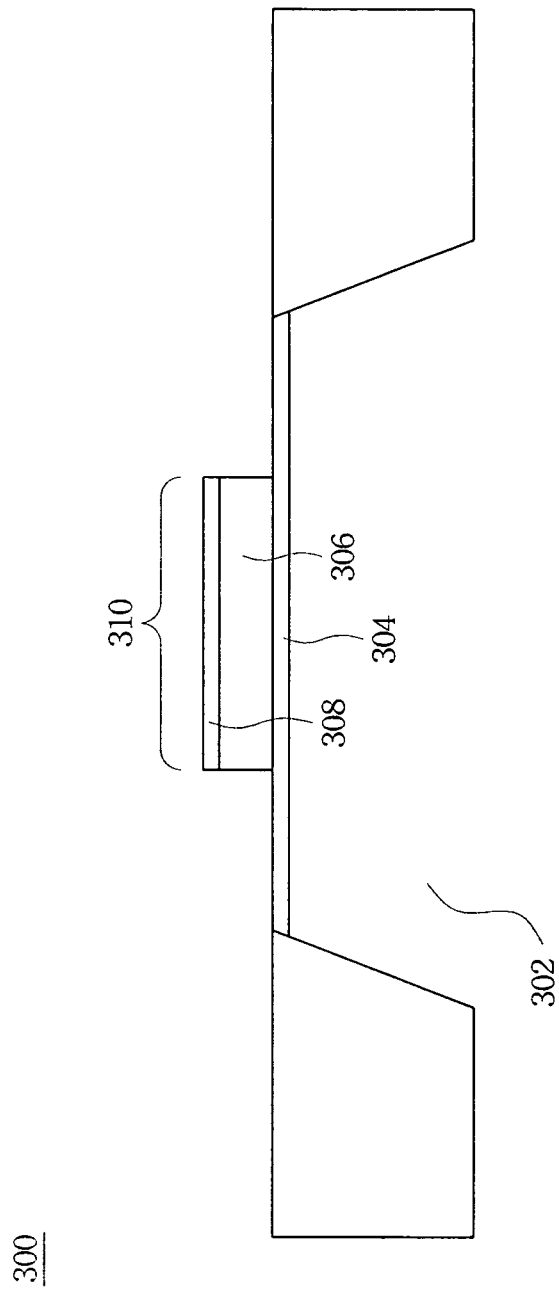
Figure 3C:
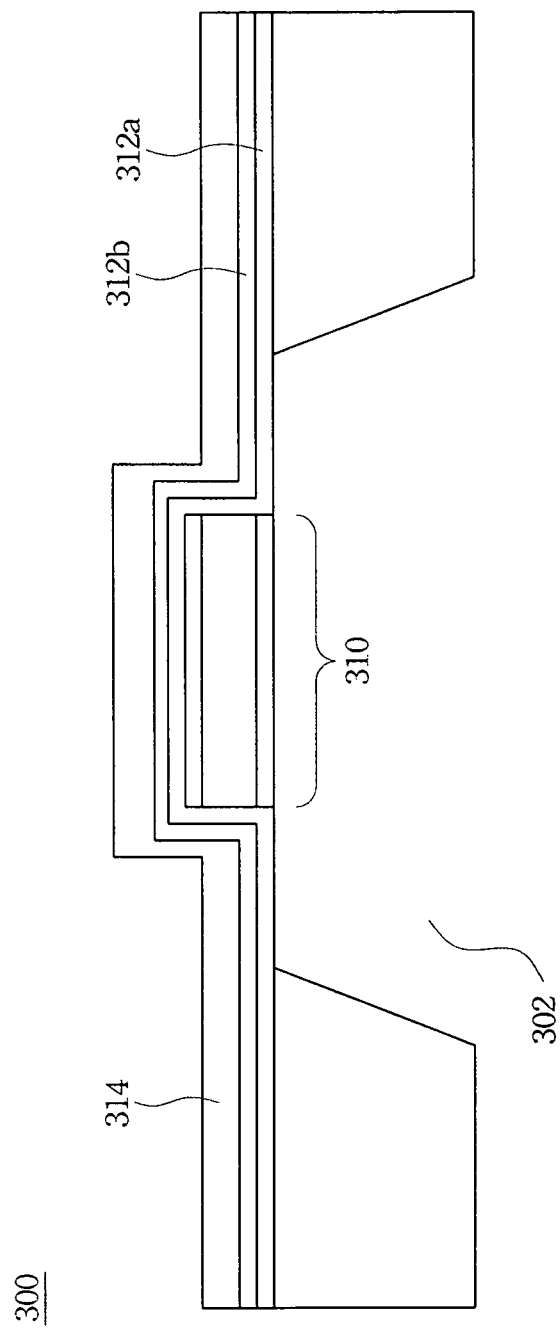
Figure 3D:
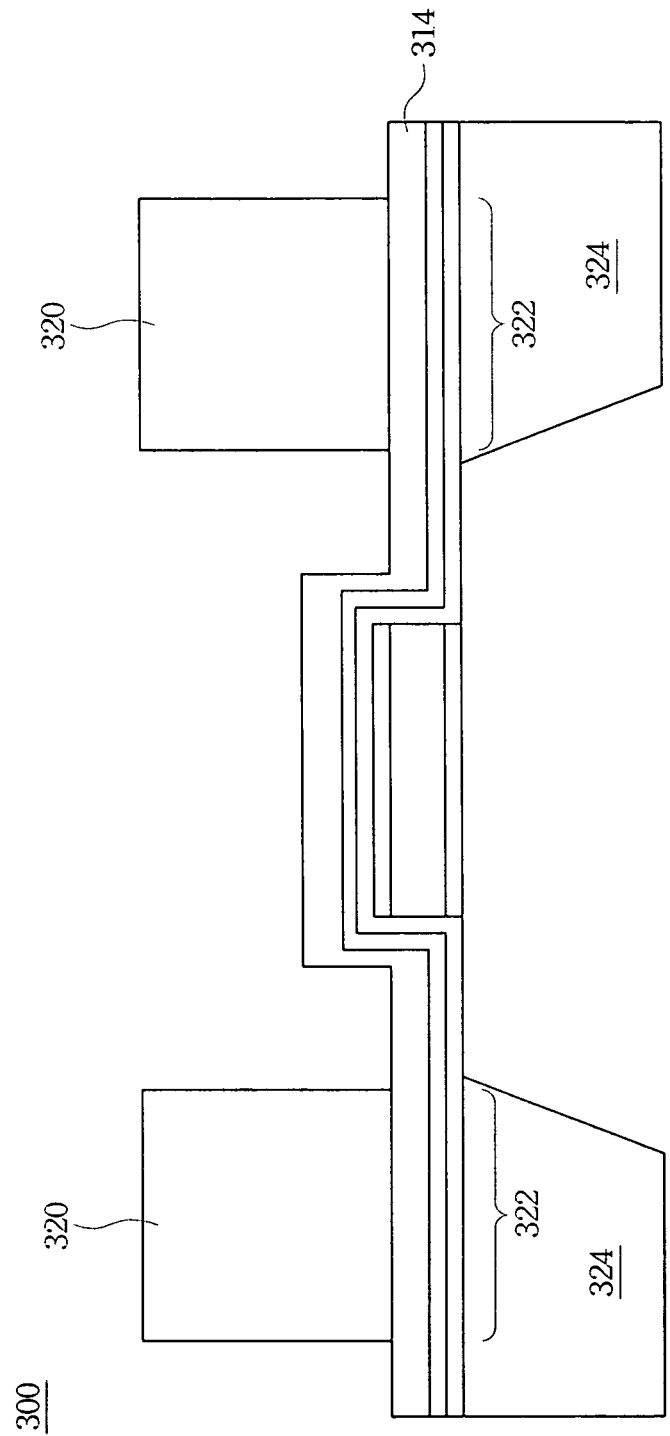

Please refer to FIG. 3A to 3I, illustrating steps in a method for fabricating a semiconductor integrated circuit having a self-aligned structure according to a second embodiment of the present invention. FIG. 3A shows a transistor 300 providing a semiconductor substrate 302 with an active area 332 surrounded by an isolation structure 324, wherein the isolation structure 324 is a shallow trench isolation structures. A gate dielectric layer 304, a first polysilicon layer 306 and a first capping layer 308 are sequentially formed on the semiconductor substrate 302. The gate dielectric layer 304 may be an oxide layer. The first capping layer 308 may be a nitride layer. As shown in FIG. 3B, after the above mentioned layers are established, a gate structure 310 is formed by patterning the first dielectric layer 304, first capping layer 308, and the first polysilicon layer 306. Patterning involves masking the gate structure 310 and etching the remaining portions of the layers. As shown in FIG. 3C, the next step is to form a composite dielectric layer 312 overlaying the semiconductor substrate 302 and on the gate structure 310. The second composite dielectric layer 312 in this embodiment comprises two dielectric sub-layers 312a and 312b. On top of the composite dielectric layers 312, a second polysilicon layer 314 is formed overlaying thereon.

Figure 3E:
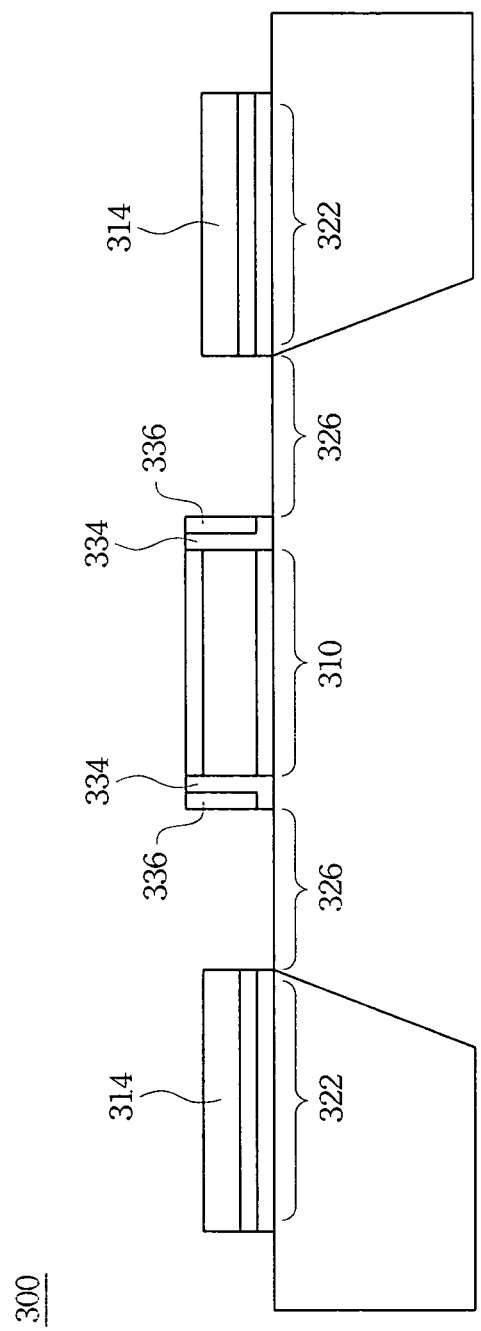

The next step is to form interconnect structure 322. Please refer to FIG. 3D, the interconnect structure 322 are defined using a patterned photo-resist layer 320, wherein the interconnect structure 322 are partially on top of the isolation structure 324 formed in the substrate using conventional techniques. FIG. 3E illustrate that the second polysilicon layer 314 is completely removed from around the gate structure 310 and the composite dielectric layer 312 is partially removed to expose a surface 326 of the semiconductor substrate 302. The residue of the composite dielectric layer 312 forms a composite layer comprising a first spacer 334 and a second spacer 336 respectively surrounding the sidewalls of the gate structure 310.

In forming the spacers 334 and 336, an anisotropic etching technique may be utilized to etch the composite dielectric layer 312 in the vertical direction removing a portion of the dielectric layers 312 on top of the gate structure 310 and on the exposed surface 326, while the remain portions of the dielectric 312 act as the sidewall spacers of the gate structure 310. Then the photo-resist layer 320 is stripped completing the patterning of the gate structure 310, and the portion of the second polysilicon layer 314 and the dielectric 312 under the photo-resist layer 320 form the interconnect structure 322.

Figure 3F:
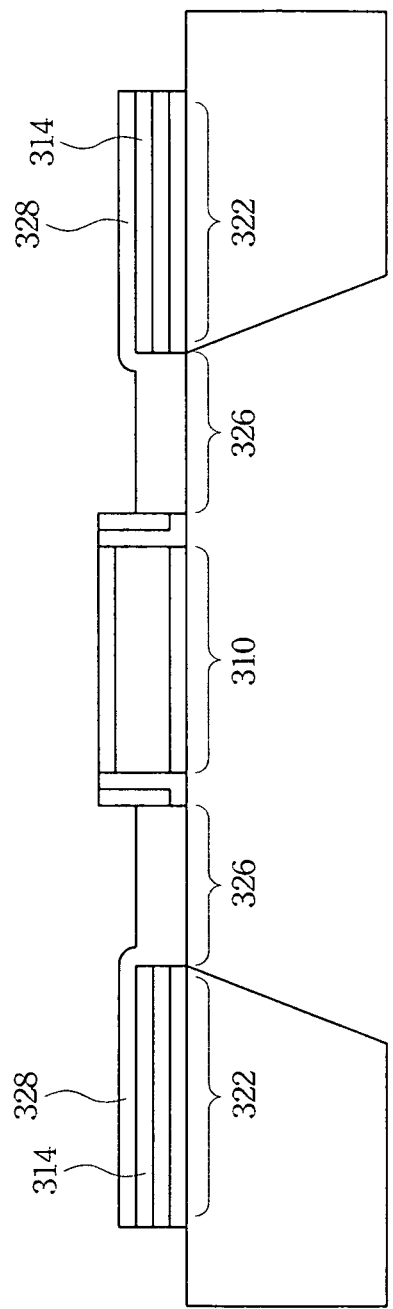

The next step is to form a selective polysilicon layer 328 that grows only on the exposed silicon surface 326 and 314, but not on the exposed dielectric layer 308 and 324 as illustrated in FIG. 3F. The selective polysilicon 328 growth technique eliminates the polysilicon etch-back step in the first embodiment of the present invention.

Figure 3G:
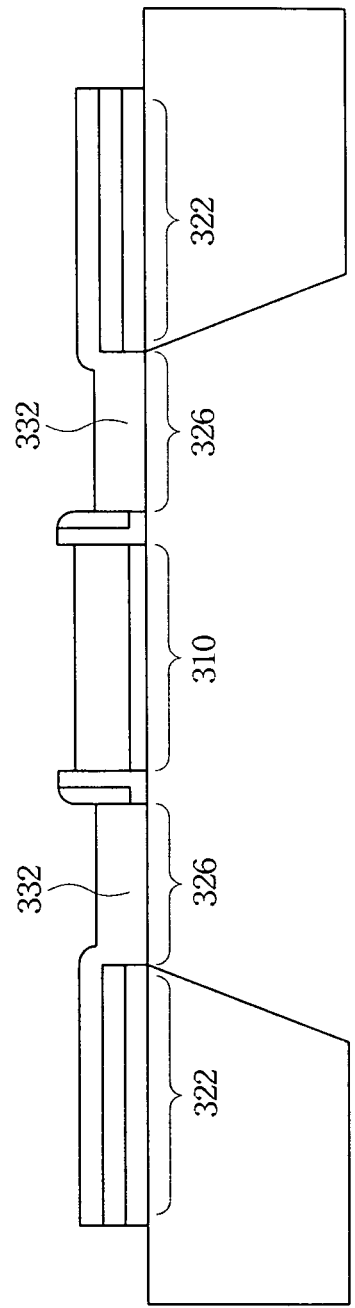
Figure 3H:
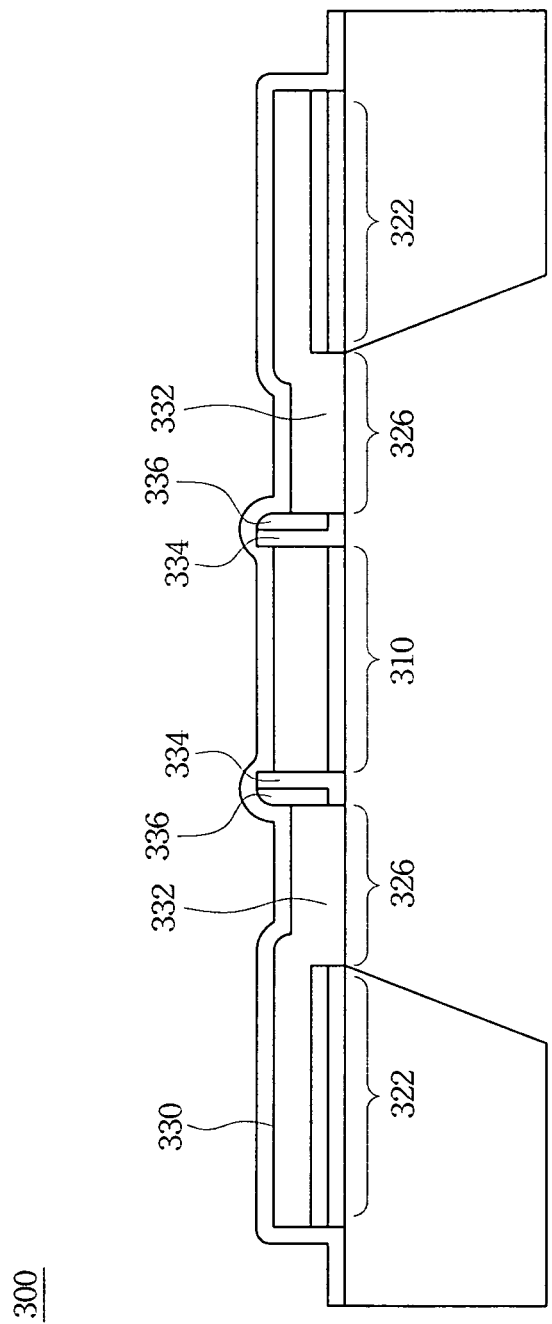

In FIGS. 3G and 3H, the remaining first capping layer 318 is removed. The residue selective polysilicon layer 328 and the second polysilicon layer 314 of the interconnect structure 322 together form a continuous polysilicon structure to be named source and drain.

It's noticed that, the dimension of the exposed active area for source and drain can be shrunk to less than minimum lithographic dimension. After defining the gate, source and drain area lithographically for appropriate dopant introduction, appropriate thermal treatment is applied to drive the dopants into the semiconductor substrate 302 through the surface 326 to form the source and drain junctions for the transistor 300. The source and drain is isolated from the gate structure 310 by the first and the second spacer 334 and 336. A blanket metal layer 330 of appropriate choice is deposited and a self-aligned silicidation process is applied. The metal layer 330 will react with polysilicon, but not with dielectric materials, thus the metal and polysilicon reaction forms a silicide layer 338 at the interface of the polysilicon of the gate structure 310 and the source and drain but remain unreacted over the first and second spacers 334 and 336 and the composite dielectric layer 312 of the interconnect structure 322.

Figure 3I:
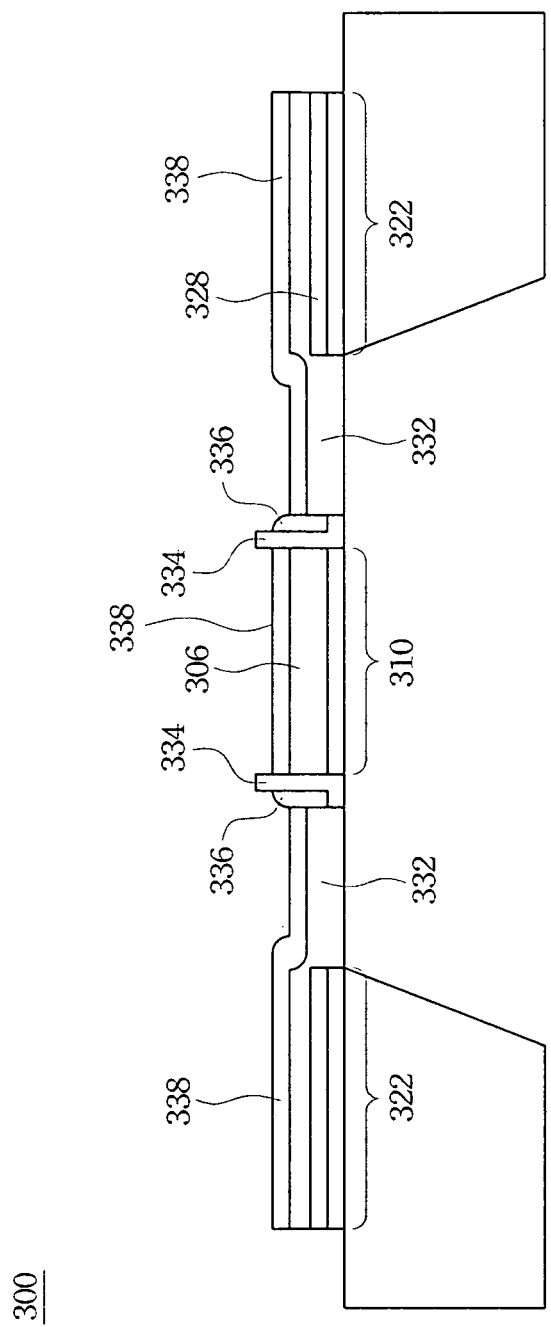

Finally, as shown in FIG. 3I, after removing the residue metal layer, a silicide layer 338 is formed on the gate structure 310 and on the source and drain so that the sidewalls of the gate structure 310, namely the first and second spacer 334 and 336 isolates the gate structure 310 from the interconnect structure 322. The silicide layer 338 may be nickel salicide, titanium salicide, cobalt salicide, platinum salicide, or tantalum salicide.

In addition, the embodiment of the present invention may optionally further includes source/drain doping, and junction driving in to form a diffused junction region in the exposed surface of the substrate or in the surface of the third polysilicon layer 228 or 328. Furthermore, after the salicide forming step, the gate cell is ready for inter-dielectric layer deposit (ILD), ILD CMP, and contact open.

The embodiments of the present invention are examples of a method for increasing device-packing density in a self-aligned device structure. As long as the height of the third polysilicon layer formed on the exposed area of the substrate, namely, the recess between the gate structure and the interconnect structures, is lower than the first and second spacers, so that the gate structure and the interconnect structures may be isolated, any polysilicon forming technique may be used.

The method allows a near obsolete IC fabrication plant to extend its life time by a generation or two. This is because the embodiments of the present invention increase the packing density of a device by approximately a factor of 2. Please refer to FIG. 4 as to measuring the dimension of an active device with self-alignment structure according to the embodiments of the present invention.

Figure 4:
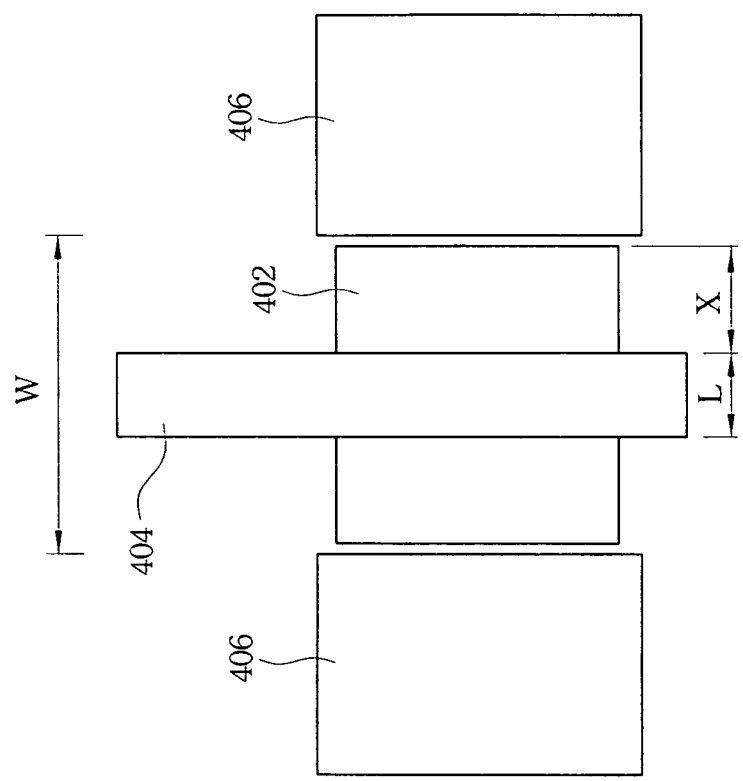
FIG. 4 is a cell of a MOS with a self-alignment gate structure according to the embodiments of the present invention.

In FIG. 4, W is calculated as:

$$W = L + 2X \quad (2)$$

where W is the active area 402 width and L is defined as the minimum length for a gate structure 404, and X is the width of the exposed surface between the gate structure 404 and the interconnect structure 406 defined by the photo resist layer like the photo resist layer 220 in the first embodiment or photo resist layer 320 in the second embodiment. After taking into consideration of needing sufficient contact area for low contact resistance, misalignment (approximately 0.1 Rm), and the lightly doped drain spacer width (approximately 0.2 to 0.3 Rm), X may be approximately 0.75 to 1 Rm. From equation 2, if L remains as Rm, then W is then calculated to be approximately 3 Rm, which is about half of the width calculated by equation 1. The above calculation is merely an example, it does not grantee a 50% decrease in device size for all applications. However, if the exposed surface requirement is smaller, then the width of the exposed surface X may further be reduced in width.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a semiconductor integrated circuit having a self-aligned structure, the method comprises the steps of:
   providing a semiconductor substrate with an active area surrounded by an isolation structure;
   sequentially forming a gate dielectric layer, a first polysilicon layer, and a
   first capping layer on top of the semiconductor substrate;

patterning the first capping layer, the first polysilicon layer and stopping on the gate dielectric layer to form a gate structure on top of the active area;

sequentially forming a composite dielectric layer and a second polysilicon layer covering the gate structure and the semiconductor substrate;

defining a patterned photo-resist layer on the second polysilicon layer;

patterning the second polysilicon layer and the composite dielectric layer to form an interconnect structure;

forming a composite spacer surrounding the sidewalls of the gate structure and exposing the first capping layer over the first polysilicon layer in the gate structure;

exposing a surface of the substrate within the active area;

removing the photo-resist layer over the interconnect structure located partially on the isolation structures to expose a top surface of the patterned second polysilicon layer of the interconnect structure;

performing a selective polysilicon deposition process over the exposed first capping layer, the exposed surface of the substrate within the active area, and the exposed top surface of the patterned second polysilicon layer of the interconnect structure such that forming a selective polysilicon layer is formed over and in direct contact with the exposed active area and the exposed top surface of the patterned second polysilicon layer of the interconnect structure, but the selective polysilicon layer is not formed over the exposed first capping layer over the gate structure;

removing the first capping layer;

defining the gate, source and drain area on the gate structure, the second polysilicon layer of the interconnect structure and the selective polysilicon layer lithographically for the proper dopant introduction;

applying thermal treatment to activate and drive-in dopants to form source and drain regions within the exposed active area under the selective polysilicon layer; and forming a self-aligned silicide layer overlying the gate structure, source, drain and the interconnect structure, with the composite spacer separating the silicide layer overlying the gate structure from the silicide layer overlying the selective polysilicon layer over the source and drain regions.

2. The method of claim 1, wherein the dimension of the exposed active area for source and drain are selected to exclude a contact opening and, thereby, can be shrunk to a dimension less than minimum lithographic dimension.

3. The method of claim 1, wherein the method further comprises forming a diffused junction region into the exposed surface of the substrate to form the source and the drain junction.

4. The method of claim 1, wherein the introduction of source, drain dopant partially penetrates the selective polysilicon layer without penetrating the first polysilicon layer of the gate structure.

5. The method of claim 1, wherein the first capping layer is a nitride layer.

6. The method of claim 1, wherein the composite layer further comprises a nitride layer.

7. The method of claim 1, wherein the composite layer further comprises an oxide sub-layer.

8. The method of claim 1, wherein the silicide layer is formed by overlaying a metal layer on the gate structure and the interconnect structure, and removing an unreacted portion of the metal layer, such that silicide is formed by a metal and polysilicon reaction.

9. The method of claim 1, wherein defining a patterned photo-resist layer on the second polysilicon layer comprises forming a photo-resist pattern, wherein a distance between an edge of the photo-resist pattern and an edge of the gate structure is less than a minimum resolution $R_m$ for the manufacture of semiconductor devices.

10. The method of claim 1, wherein a distance between an edge of the exposed first capping layer and an edge of the exposed top surface of the patterned second polysilicon layer of the interconnect structure is less than a minimum resolution $R_m$ for the manufacture of semiconductor devices.

* * * * *